United States Patent
Doller et al.

(10) Patent No.: US 11,462,273 B2
(45) Date of Patent: Oct. 4, 2022

(54) SSD WITH REDUCED SECURE ERASE TIME AND ENDURANCE STRESS

(71) Applicant: Intel Corporation, Santa Clara, CA (US)

(72) Inventors: Joseph Doller, El Dorado Hills, CA (US); Kristopher Gaewsky, El Dorado Hills, CA (US); Byeongkyu Cho, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/874,242

(22) Filed: May 14, 2020

(65) Prior Publication Data
US 2020/0273525 A1    Aug. 27, 2020

(51) Int. Cl.
*G11C 16/16* (2006.01)
*G06F 3/06* (2006.01)
*G11C 16/04* (2006.01)

(52) U.S. Cl.
CPC ............ *G11C 16/16* (2013.01); *G06F 3/0604* (2013.01); *G06F 3/0652* (2013.01); *G06F 3/0679* (2013.01); *G11C 16/0483* (2013.01)

(58) Field of Classification Search
CPC ... G11C 16/16; G11C 16/0483; G11C 16/344; G11C 16/3445; G06F 3/0604; G06F 3/0679; G06F 3/0652; G06F 3/0616; G06F 12/0246
See application file for complete search history.

(56) References Cited

U.S. PATENT DOCUMENTS

| 9,633,738 | B1 * | 4/2017 | Guo | G11C 16/22 |
| 10,141,060 | B1 * | 11/2018 | Iwai | G11C 16/16 |
| 2014/0019675 | A1 * | 1/2014 | Oh | G11C 16/0466 |
| | | | | 711/103 |

OTHER PUBLICATIONS

Jaeyong Jeong et al., "Lifetime Improvement of NAND Flash-based Storage Systems Using Dynamic Program and Erase Scaling", Feb. 2014, USENIX, 12th USENIX Conference on File and Storage Technologies (FAST '14), pp. 61-74 (Year: 2014).*

* cited by examiner

*Primary Examiner* — Reginald G Bragdon
*Assistant Examiner* — Curtis James Kortman
(74) *Attorney, Agent, or Firm* — Haley Guiliano LLP (57) ABSTRACT

An embodiment of an electronic apparatus may include one or more substrates, and logic coupled to the one or more substrates, the logic to set an erase voltage for a first block of a persistent storage media to a default erase voltage, determine if the first block of the persistent storage media is identified for a secure erase operation, and set the erase voltage for the first block of the persistent storage media to a shallow erase voltage if the first block of the persistent storage media is identified for the secure erase operation, where the shallow erase voltage corresponds to a weaker erase operation relative to the default erase voltage. Other embodiments are disclosed and claimed.

15 Claims, 9 Drawing Sheets

SSD WITH REDUCED SECURE ERASE TIME AND ENDURANCE STRESS

BACKGROUND

Some solid state drives (SSDs) may implement a secure erase command, such as ATA_SECURE_ERASE, SANTIZE BLOCK ERASE, etc. When this type of command is issued the entire drive is erased and placed in an erase dwell time control (EDTC) state. For a NAND-based storage device, executing a BLOCK ERASE on each element in the NAND array may securely eliminate data from the media on the device. Each targeted storage element may be raised to an erase voltage (e.g., which may be significantly higher than the standard program voltage). The signal is then moved to ground, leaving no trace of the previous signal. The storage element may then be placed in a state where it is ready to be programmed with new data.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
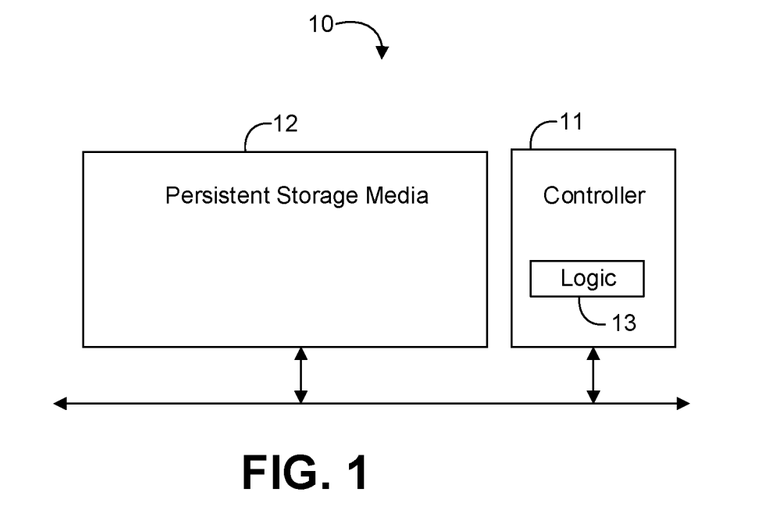
FIG. 1 is a block diagram of an example of an electronic storage system according to an embodiment.

With reference to FIG. 1, an embodiment of an electronic storage system 10 may include persistent storage media 12, and a controller 11 communicatively coupled to the persistent storage media 12. The controller 11 may include logic 13 to set an erase voltage for a first block of the persistent storage media 12 to a default erase voltage, determine if the first block of the persistent storage media 12 is identified for a secure erase operation, and set the erase voltage for the first block of the persistent storage media 12 to a shallow erase voltage if the first block of the persistent storage media 12 is identified for the secure erase operation, where the shallow erase voltage corresponds to a weaker erase operation relative to the default erase voltage. For example, the shallow erase voltage may be between the default erase voltage and an erase dwell time control (EDTC) state voltage. In some embodiments, the logic 13 may be further configured to perform an erase operation on the first block, determine if the first block is erased, and place the first block in an EDTC state and set the erase voltage for the first block back to the default erase voltage, if the first block is determined to be erased.

In some embodiments, the logic 13 may be configured to set the erase voltage for one or more blocks of the persistent storage media 12 (e.g., including the first block) to the default erase voltage, identify the one or more blocks of the persistent storage media 12 for the secure erase operation, set the erase voltage for the identified one or more blocks to the shallow erase voltage (e.g., where the shallow erase voltage corresponds to a more shallow erase distribution relative to the default erase voltage), and perform an erase operation on the identified one or more blocks. The logic 13 may be further configured to determine if all of the identified one or more blocks are erased, and place the identified one or more blocks in an EDTC state and set the erase voltage for the identified one or more blocks back to the default erase voltage, if all of the identified one or more blocks are determined to be erased.

In some embodiments, the persistent storage media 12 may comprise one or more memory die, and the logic 13 may be further configured to identify one or more blocks of the persistent storage media 12 (e.g., including the first block) for the secure erase operation in response to a command, set the erase voltage to the shallow erase voltage on each memory die of the persistent storage media 12 which corresponds to the identified one or more blocks, perform an erase operation for each of the identified one or more blocks after the erase voltage is set to the shallow erase voltage for each memory die, determine if all of the identified one or more blocks are erased, and place all of the identified one or more blocks in an EDTC state and set the erase voltage on each memory die for the identified one or more blocks back to the default erase voltage after all of the identified one or more blocks are determined to be erased. In any of the embodiments herein, the persistent storage media 12 and/or controller 11 may be part of a solid state drive (SSD).

Embodiments of each of the above controller 11, persistent storage media 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a micro-controller, a general purpose processor, a special purpose processor, a central processor unit (CPU), an execution unit, etc. In some embodiments, the persistent storage media 12, the logic 13, and/or other system memory may be located in, or co-located with, various components, including the controller 11 (e.g., on a same die).

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the persistent storage media 12, other persistent storage media, or other system memory may store a set of instructions which when executed by the controller 11 cause the system 10 to implement one or more components, features, or aspects of the system 10 (e.g., the logic 13, setting the erase voltage for the first block to the default erase voltage, determining if the first block is identified for the secure erase operation, setting the erase voltage for the first block to the shallow erase voltage, etc.).

Figure 2:
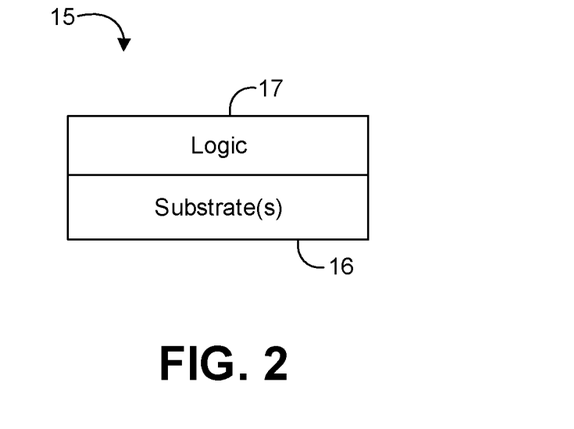
FIG. 2 is a block diagram of an example of an electronic apparatus according to an embodiment.
Figure 3A:
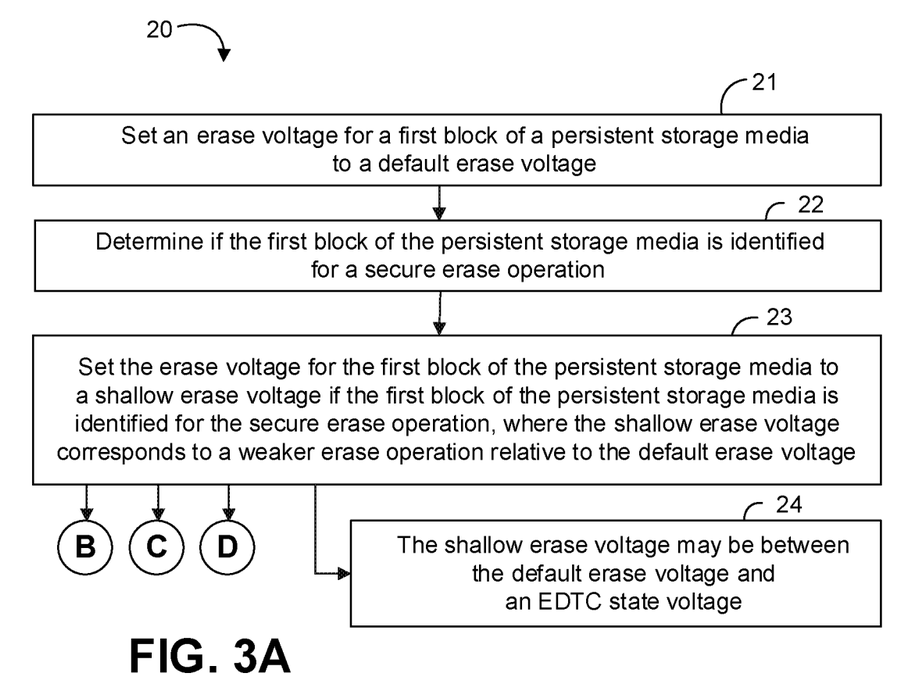
FIGS. 3A to 3D are flowcharts of an example of a method of controlling storage according to an embodiment.
Figure 3B:
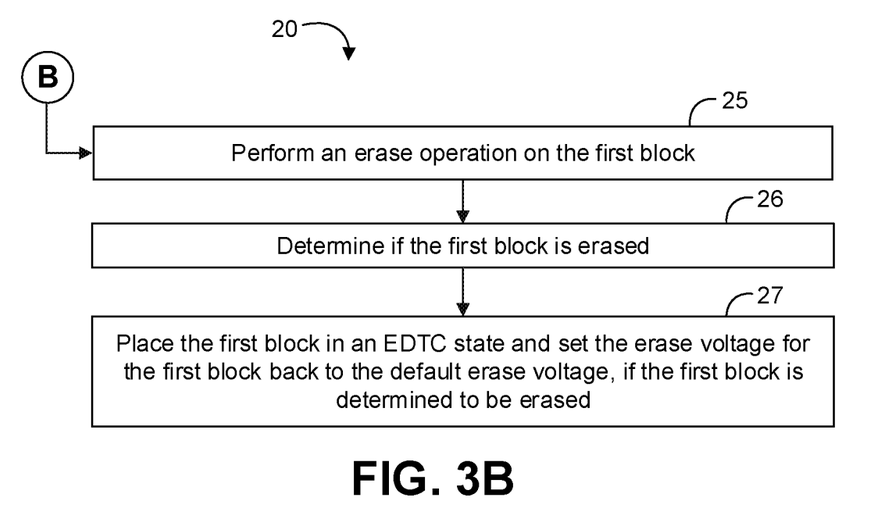
Figure 3C:
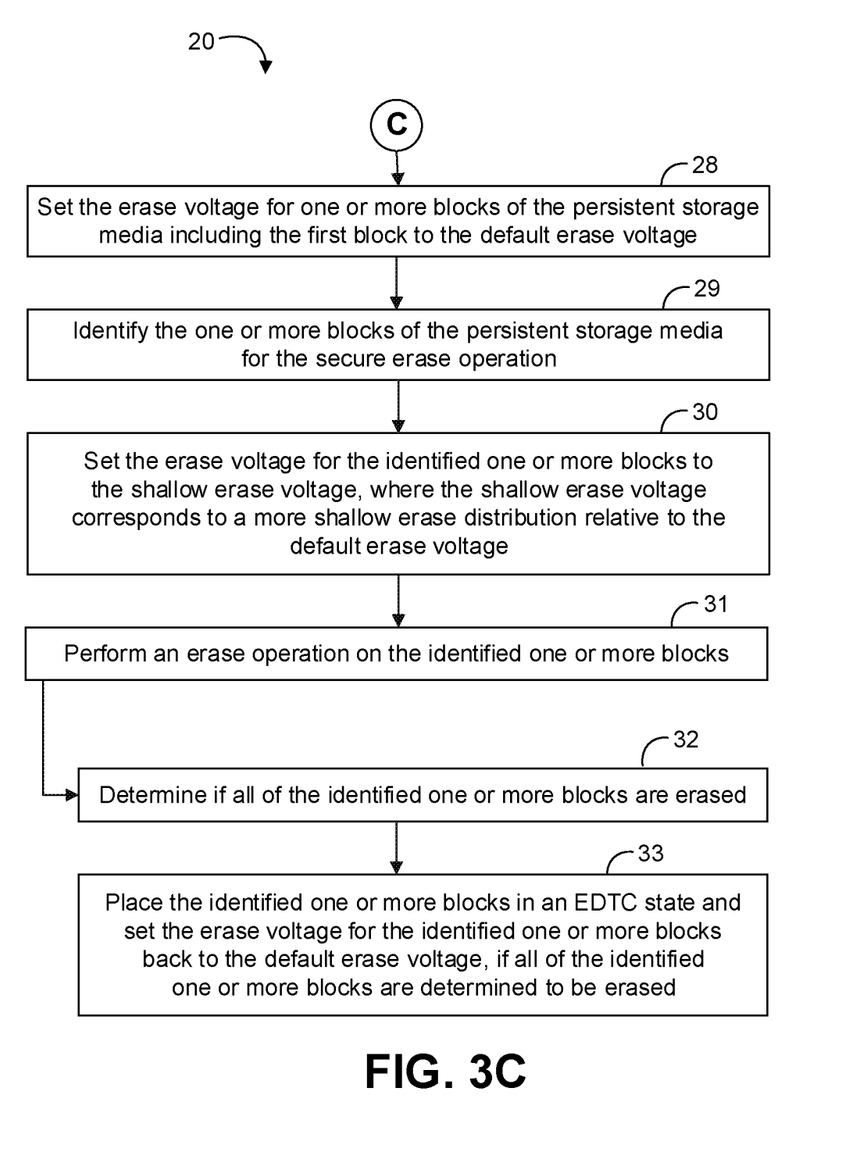
Figure 3D:
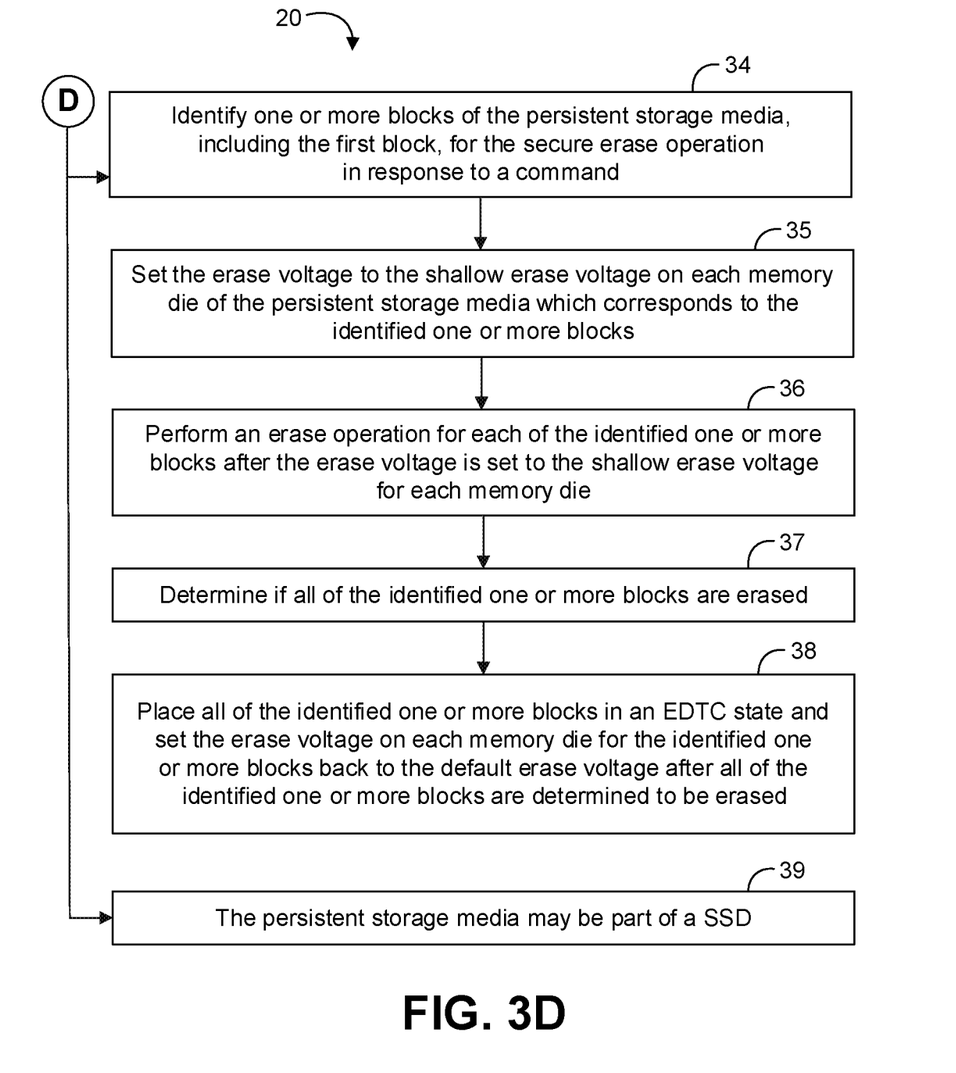

Turning now to FIG. 2, an embodiment of an electronic apparatus 15 may include one or more substrates 16, and logic 17 coupled to the one or more substrates 16. The logic 17 may be configured to set an erase voltage for a first block of a persistent storage media to a default erase voltage, determine if the first block of the persistent storage media is identified for a secure erase operation, and set the erase voltage for the first block of the persistent storage media to a shallow erase voltage if the first block of the persistent storage media is identified for the secure erase operation, where the shallow erase voltage corresponds to a weaker erase operation relative to the default erase voltage. For example, the shallow erase voltage may be between the default erase voltage and an EDTC state voltage. In some embodiments, the logic 17 may be further configured to perform an erase operation on the first block, determine if the first block is erased, and place the first block in an EDTC state and set the erase voltage for the first block back to the default erase voltage, if the first block is determined to be erased.

In some embodiments, the logic 17 may be configured to set the erase voltage for one or more blocks of the persistent storage media (e.g., including the first block) to the default erase voltage, identify the one or more blocks of the persistent storage media for the secure erase operation, set the erase voltage for the identified one or more blocks to the shallow erase voltage (e.g., where the shallow erase voltage corresponds to a more shallow erase distribution relative to the default erase voltage), and perform an erase operation on the identified one or more blocks. The logic 17 may be further configured to determine if all of the identified one or more blocks are erased, and place the identified one or more blocks in an EDTC state and set the erase voltage for the identified one or more blocks back to the default erase voltage, if all of the identified one or more blocks are determined to be erased.

In some embodiments, the persistent storage media may comprise one or more memory die, and the logic 17 may be further configured to identify one or more blocks of the persistent storage media (e.g., including the first block) for the secure erase operation in response to a command, set the erase voltage to the shallow erase voltage on each memory die of the persistent storage media which corresponds to the identified one or more blocks, perform an erase operation for each of the identified one or more blocks after the erase voltage is set to the shallow erase voltage for each memory die, determine if all of the identified one or more blocks are erased, and place all of the identified one or more blocks in an EDTC state and set the erase voltage on each memory die for the identified one or more blocks back to the default erase voltage after all of the identified one or more blocks are determined to be erased. In any of the embodiments herein, the persistent storage media may be part of a SSD.

Embodiments of the logic 17 may be implemented in a system, apparatus, computer, device, etc., for example, such as those described herein. More particularly, hardware implementations of the logic 17 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 17 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the logic 17 may be implemented on a semiconductor apparatus, which may include the one or more substrates 16, with the logic 17 coupled to the one or more substrates 16. In some embodiments, the logic 17 may be at least partly implemented in one or more of configurable logic and fixed-functionality hardware logic on semiconductor substrate(s) (e.g., silicon, sapphire, gallium-arsenide, etc.). For example, the logic 17 may include a transistor array and/or other integrated circuit components coupled to the substrate(s) 16 with transistor channel regions that are positioned within the substrate(s) 16. The interface between the logic 17 and the substrate(s) 16 may not be an abrupt junction. The logic 17 may also be considered to include an epitaxial layer that is grown on an initial wafer of the substrate(s) 16.

Turning now to FIGS. 3A to 3D, an embodiment of a method 20 of controlling storage may include setting an erase voltage for a first block of a persistent storage media to a default erase voltage at box 21, determining if the first block of the persistent storage media is identified for a secure erase operation at box 22, and setting the erase voltage for the first block of the persistent storage media to a shallow erase voltage if the first block of the persistent storage media is identified for the secure erase operation, where the shallow erase voltage corresponds to a weaker erase operation relative to the default erase voltage, at box 23. For example, the shallow erase voltage may be between the default erase voltage and an EDTC state voltage at box 24. Some embodiments of the method 20 may further include performing an erase operation on the first block at box 25, determining if the first block is erased at box 26, and placing the first block in an EDTC state and setting the erase voltage for the first block back to the default erase voltage, if the first block is determined to be erased, at box 27.

In some embodiments, the method 20 may further include setting the erase voltage for one or more blocks of the persistent storage media including the first block to the default erase voltage at box 28, identifying the one or more blocks of the persistent storage media for the secure erase operation at box 29, setting the erase voltage for the identified one or more blocks to the shallow erase voltage, where the shallow erase voltage corresponds to a more shallow erase distribution relative to the default erase voltage at box 30, and performing an erase operation on the identified one or more blocks at box 31. The method 20 may also include determining if all of the identified one or more blocks are erased at box 32, and placing the identified one or more blocks in an EDTC state and setting the erase voltage for the identified one or more blocks back to the default erase voltage, if all of the identified one or more blocks are determined to be erased, at box 33.

In some embodiments, the persistent storage media may comprise one or more memory die, and the method 20 may further include identifying one or more blocks of the persistent storage media, including the first block, for the secure erase operation in response to a command at block 34, setting the erase voltage to the shallow erase voltage on each memory die of the persistent storage media which corresponds to the identified one or more blocks at block 35, performing an erase operation for each of the identified one or more blocks after the erase voltage is set to the shallow erase voltage for each memory die at block 36, determining if all of the identified one or more blocks are erased at block 37, and placing all of the identified one or more blocks in an EDTC state and setting the erase voltage on each memory die for the identified one or more blocks back to the default erase voltage after all of the identified one or more blocks are determined to be erased, at block 38. In any of the embodiments herein, the persistent storage media may be part of a SSD at block 39.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 20 may be implemented on a computer readable medium. Embodiments or portions of the method 20 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide technology for reducing secure erase time and endurance stress on SSDs. Some SSDs may have a customer command to perform a secure erase (e.g., more secure than simply overwriting the data), such as the ATA_SECURE_ERASE command, a NVMe SANITIZE command, etc. When this command is issued the entire drive is erased and placed in an EDTC state. Preferably, the secure erase operation should be reasonably fast (e.g., less than 1 minute for a large capacity SSD) and not cause a large amount of endurance issues. Some SSDs may include multiple decks and a full secure erase command may correspond to a deck level command instead of a block level command. For a NAND-based SSD with three (3) decks, for example, the controller must send three (3) times the amount of erase commands as compared to a one (1) deck SSD. As the capacity and/or number of decks in NAND-based devices increases, the secure erase time may become unacceptably slow. For example, when a secure erase command is issued, the SSD controller may step though every block on the media, erase it, and then place the block in an EDTC state. The erase operation may take a long time in a conventional SSD, especially as the NAND media is program/erase cycled. For example, the secure erase time may be acceptable at cycle zero (0), but become unacceptably slow as the SSD approaches end of life. Moreover, there may be a large amount of stress to the NAND media when the SSD is secure erased. For some conventional SSDs, a secure erase may be counted as several program/erase cycles relative to the endurance of the drive. Advantageously, some embodiments may provide technology to reduce the secure erase time and/or the endurance stress for a SSD.

In accordance with some embodiments, as part of the secure erase flow, a SSD may change internal NAND trims to force the erase distribution to be very shallow. Advantageously, embodiments of shallow erase technology may be much faster than conventional secure erase technology (e.g., about three (3) ms per block at end of life as compared to about forty (40) ms per block at end of life). Even as compared to a normal block erase time, embodiments of a secure shallow erase may be measurably faster. For example, embodiments of a secure shallow erase may take significantly less time than the amount of time it would take to erase or overwrite the drive at the normal erase voltage. After confirming the shallow erase was successful, in accordance with some embodiments, the erased blocks may be placed into an EDTC state and the NAND trims may be set back to their default value. Advantageously, in some embodiments the secure erase time may be cycle agnostic and about four time (4×) faster than some conventional cycle 0 secure erase times (e.g., about three (3) ms per block at cycle 0 as compared to about thirteen (13) ms per block at cycle 0). Some embodiments may also advantageously reduce the stress on the NAND for a secure erase significantly, which may reduce the number of program/erase cycles counted against the endurance of the drive.

Figure 4:
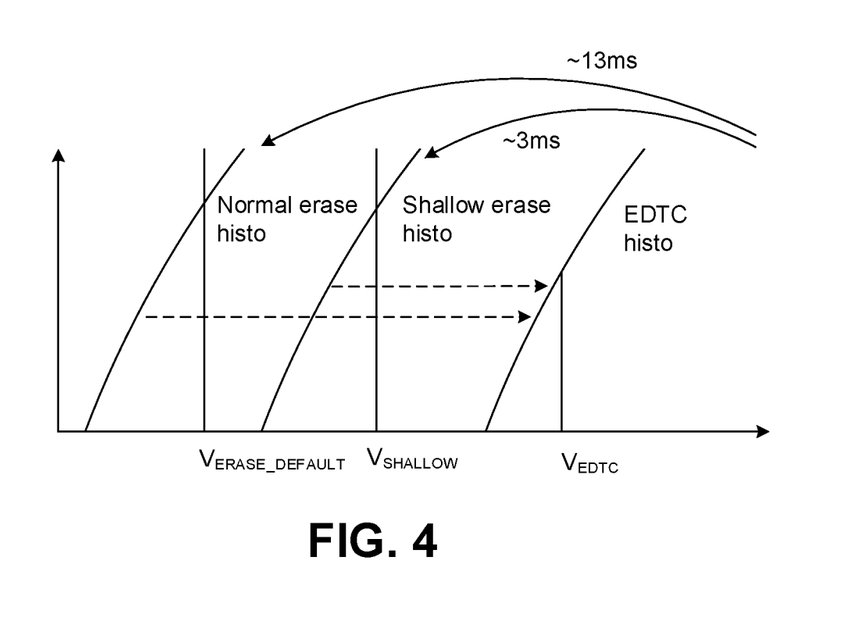
FIG. 4 is an illustrative graph showing example histograms according to an embodiment.

With reference to FIG. 4, an embodiment of an illustrative graph shows example histograms at a nominal, default erase voltage ($V_{ERASE\_DEFAULT}$), a voltage for an EDTC state ($V_{EDTC}$), and a shallow erase voltage ($V_{SHALLOW}$) which falls in between $V_{ERASE\_DEFAULT}$ and $V_{EDTC}$. To get all of the erased NAND media to the final EDTC state quickly (e.g., while also meeting all of the EDTC state requirements), some embodiments advantageously move the erase verify voltage up (e.g., one or two volts for some NAND media). At the weaker erase verify voltage, almost all erase commands may verify after the first erase pulse. The erase operation must still pass verification, however, in the unlikely case that the erase operation was a failure or that the erase operation needs a second erase pulse.

In some embodiments, as shown in FIG. 4, the erase time goes from about 13 ms for $V_{ERASE\_DEFAULT}$ to about 3 ms for $V_{SHALLOW}$. Embodiments of the secure shallow erase technology described herein applied to post cycled units (e.g., at or near end of life) demonstrated that the weaker erase verify voltage remained effective even at end of life (e.g., when NAND media may be more difficult to erase). Accordingly, some embodiments of secure shallow erase technology may take considerably less time than a conventional secure erase flow, may take the same amount of time regardless of NAND cycle count, and/or may cause less stress to the NAND such that the NAND cycle cost of a secure erase may be reduced. A further advantage of some embodiments, as can be seen in FIG. 4, is that the shallow erase distribution only moves up slightly to get into the EDTC state (e.g., from $V_{SHALLOW}$ to $V_{EDTC}$, instead of from $V_{ERASE\_DEFAULT}$ to $V_{EDTC}$). The smaller voltage movement may reduce the stress of the EDTC program and may reduce the cycling penalty for the drive (e.g., the program/erase cycle count for the secure shallow erase operation may be less than the program/erase cycle count for a conventional secure erase operation).

Figure 5:
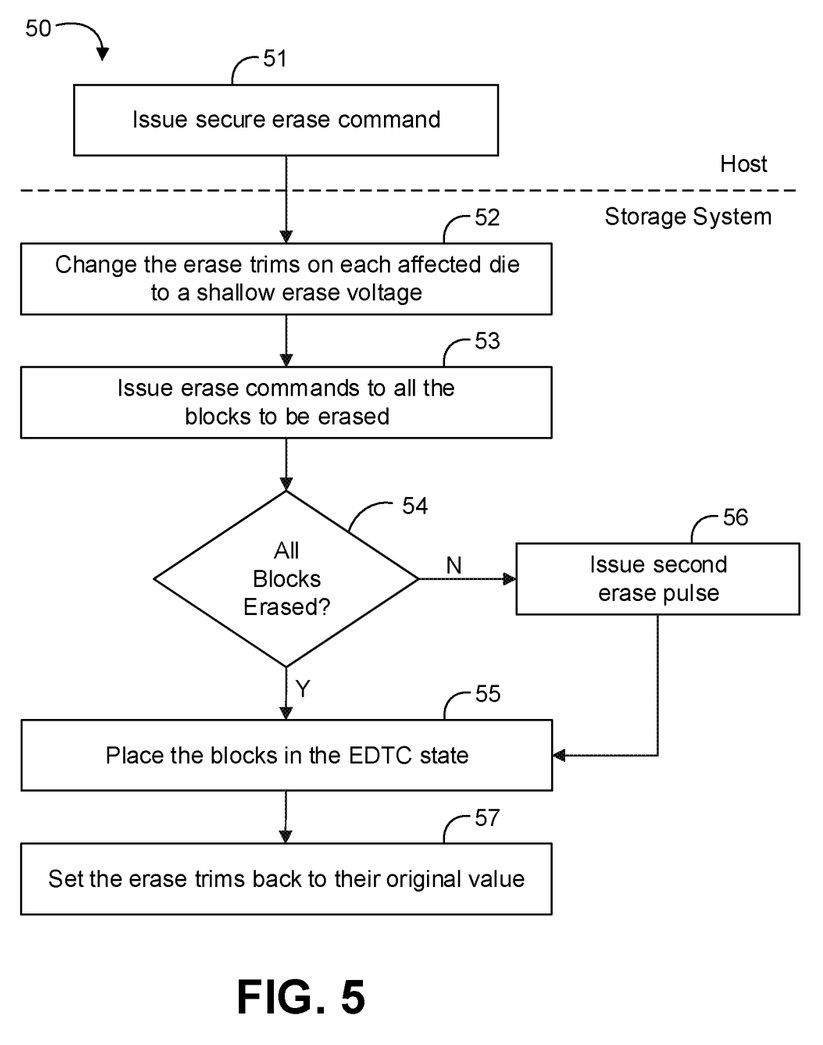
FIG. 5 is a flowchart of another example of a method of controlling storage according to an embodiment.

With reference to FIG. 5, an embodiment of a method 50 of controlling storage may include the host issuing a secure erase command at box 51. Next, in response to the command, the method 50 includes the storage system changing the erase trims on each affected die to a shallow erase voltage at box 52 (e.g., via firmware (FW) setting appropriate register values), and then issuing erase commands to all the blocks to be erased at box 53. The method may include the storage system verifying that all blocks are erased at box 54 and, if so, placing the blocks in the EDTC state at box 55. If needed, a second erase pulse may be applied at box 56. After all the blocks are erased, the method 50 may include the storage system setting the erase trims back to their original value at box 57.

Figure 6:
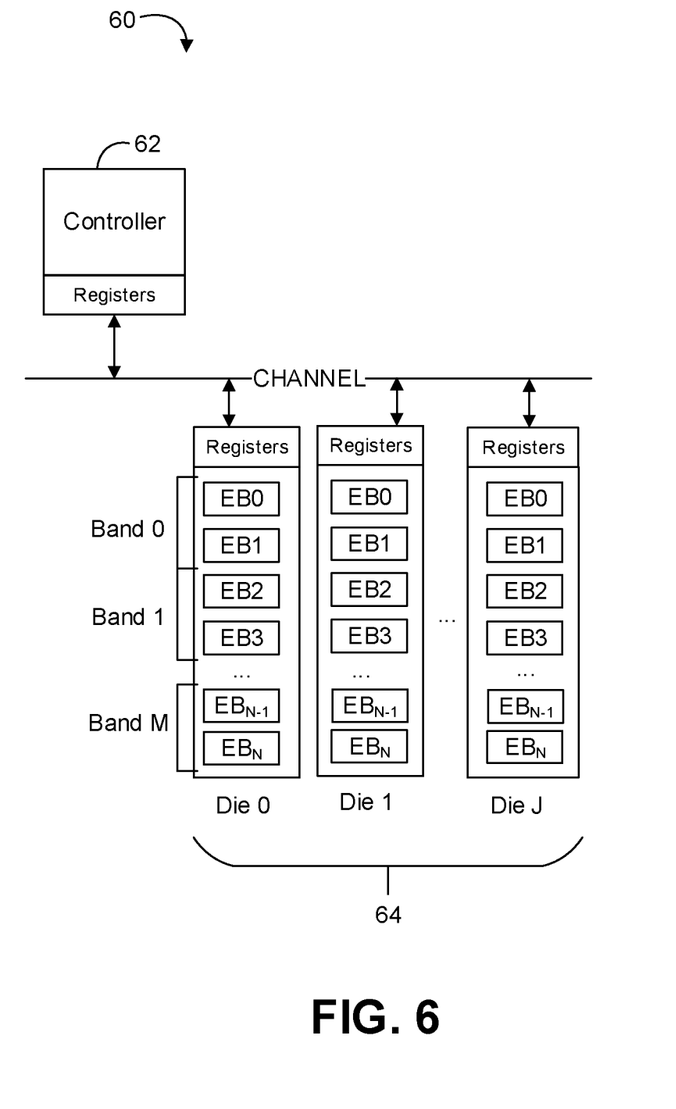
FIG. 6 is a block diagram of another example of an electronic storage system according to an embodiment.

With reference to FIG. 6, an embodiment of an electronic storage system 60 may include a controller 62 coupled through a channel to one or more NAND die 64. The controller 62 may include a plurality of register configurations, and each of the NAND die 64 may include associated registers. In some embodiments, the NAND die 64 may include Die 0 through J (J>1). Each Die 0 though J may include erase blocks (EBs) EB0 through $EB_N$ (N>1). The EBs may be organized in bands 0 through M (M>1). For example, a band may refer to a set of equal logically numbered NAND EBs which span across all NAND die in a given NAND array. The components of the storage system 60 may cooperate (e.g., through suitable firmware (FW)) to provide secure shallow erase technology for the media. For example, FW code may identify an individual EB, groups of EBs, other subsets of the NAND array (e.g., including bands), an individual NAND dice, or the entire storage system 60 to be securely erased with the shallow erase voltage (e.g., in response to a command from a host/user/agent, etc.). To accomplish the shallow erase, NAND channel registers may be configured to adjust reference, program, and/or erase voltage levels (e.g., NAND trims) on the media to erase specific physical addresses at the appropriate erase trim (e.g., normal erase trim for some blocks, shallow erase trim for identified blocks, etc.).

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 7:
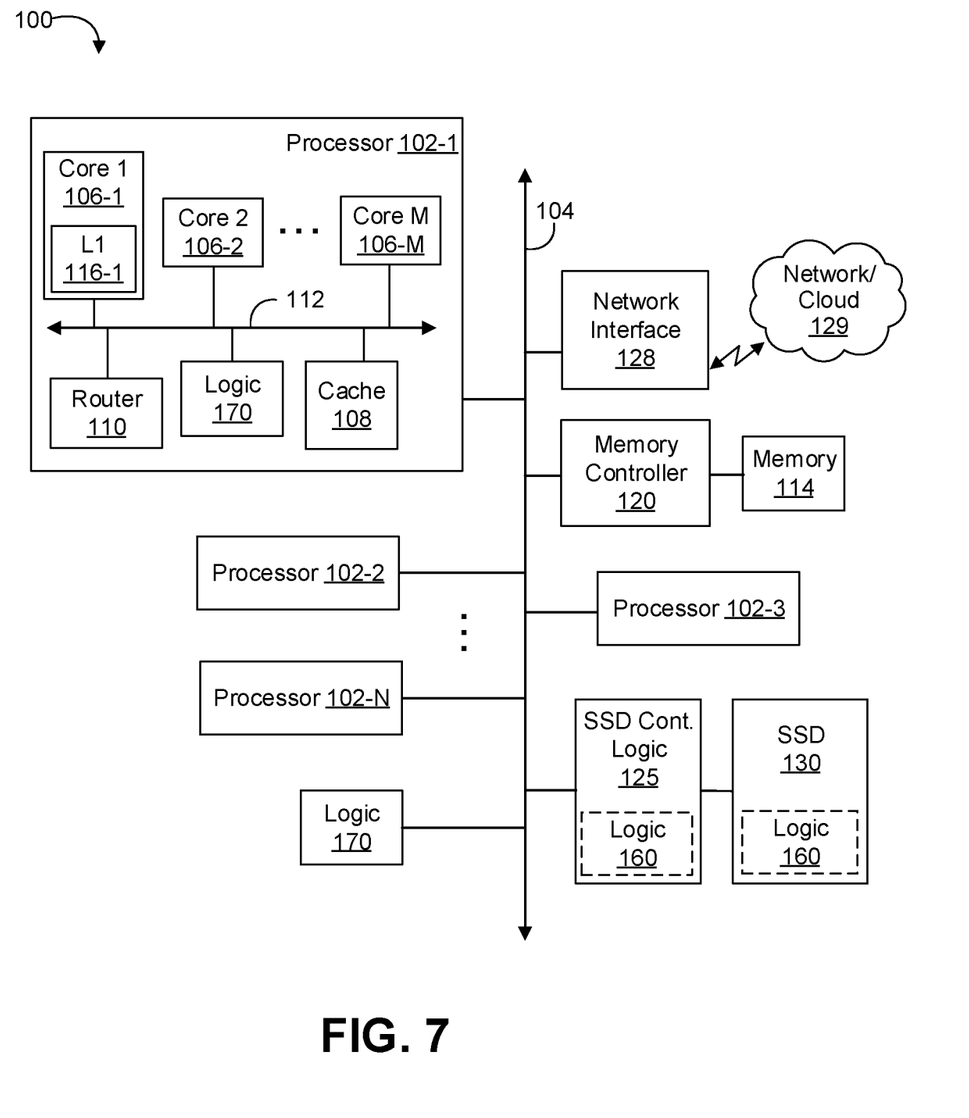
FIG. 7 is a block diagram of an example of a computing system according to an embodiment.

Turning now to FIG. 7, an embodiment of a computing system 100 may include one or more processors 102-1 through 102-N (generally referred to herein as "processors 102" or "processor 102"). The processors 102 may communicate via an interconnection or bus 104.

Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 170, memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 7, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 7, memory 114 may be coupled to other components of system 100 through a memory controller 120. Memory 114 may include volatile memory and may be interchangeably referred to as main memory or system memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include a storage device such as a SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 7, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc.) Additionally, logic 125 may be incorporated into memory controller logic (such as those discussed with reference to FIG. 8) or provided on a same integrated circuit (IC) device in various embodiments (e.g., on the same circuit board device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD 130, SSD bus, SATA bus, logic 125, logic 160, logic 170, etc., to sense variations in various factors affecting power/thermal behavior of the system/platform, such as temperature, operating frequency, operating voltage, power consumption, and/or inter-core communication activity, etc.

Figure 8:
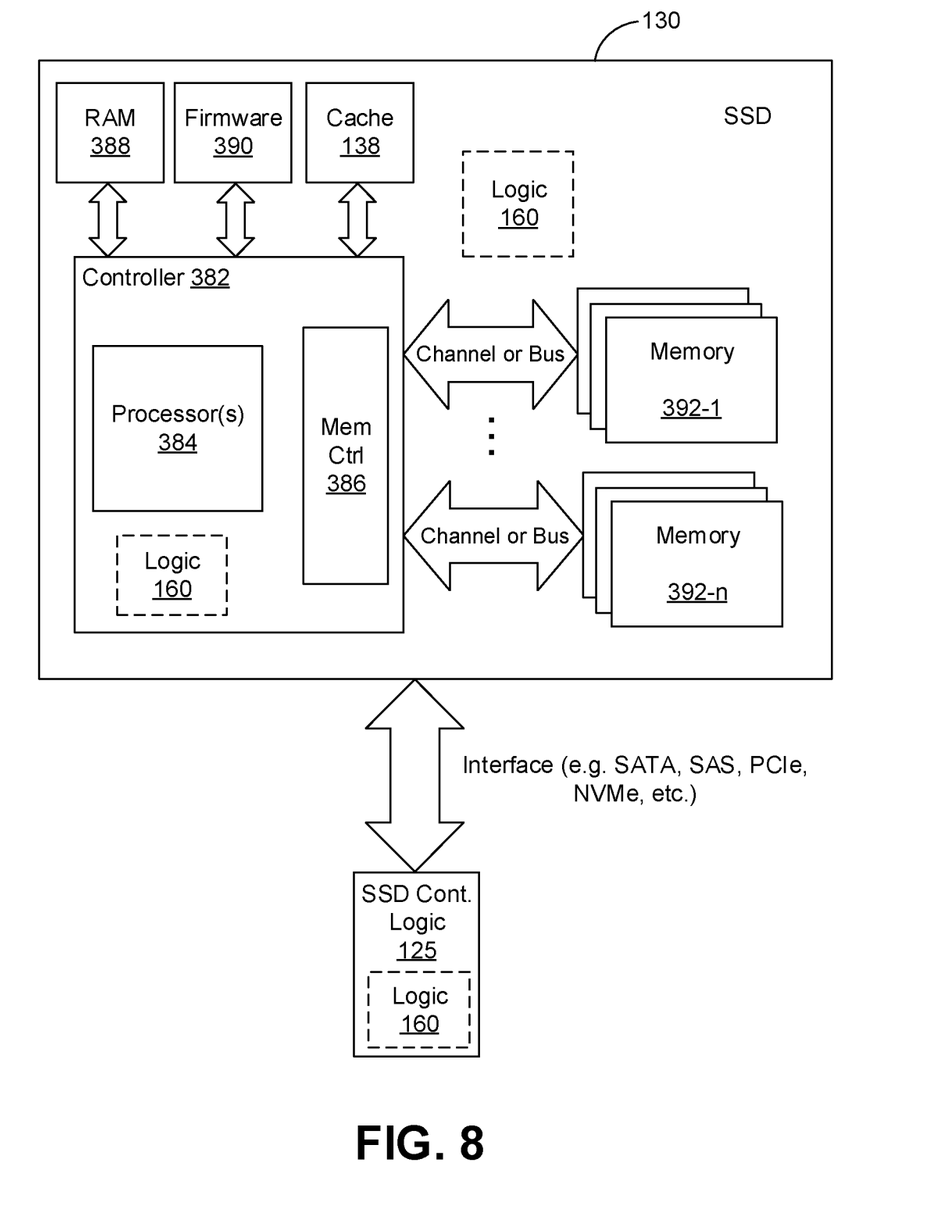
FIG. 8 is a block diagram of an example of a solid state drive (SSD) device according to an embodiment.

FIG. 8 illustrates a block diagram of various components of the SSD 130, according to an embodiment. As illustrated in FIG. 8, logic 160 may be located in various locations such as inside the SSD 130 or controller 382, etc., and may include similar technology as discussed in connection with FIG. 7. The SSD 130 includes a controller 382 (which in turn includes one or more processor cores or processors 384 and memory controller logic 386), cache 138, RAM 388, firmware storage 390, and one or more memory devices 392-1 to 392-N (collectively memory 392, which may include 3D crosspoint, or other types of non-volatile memory). The memory 392 is coupled to the memory controller logic 386 via one or more memory channels or busses. Also, SSD 130 communicates with logic 125 via an interface (such as a SATA, SAS, PCIe, NVMe, etc., interface). Processors 384 and/or controller 382 may compress/decompress data written to or read from memory devices 392-1 to 392-N.

As illustrated in FIGS. 7 and 8, the SSD 130 may include logic 160, which may be in the same enclosure as the SSD 130 and/or fully integrated on a printed circuit board (PCB) of the SSD 130. The system 100 may include further logic 170 outside of the SSD 130. One or more of the features/aspects/operations discussed with reference to FIGS. 1-6 may be performed by one or more of the components of FIGS. 7 and/or 8. Also, one or more of the features/aspects/operations of FIGS. 1-6 may be programmed into the firmware 390. Further, SSD controller logic 125 may also include logic 160. Advantageously, the logic 160 and/or logic 170 may include technology to implement one or more aspects of the system 10 (FIG. 1), the apparatus 15 (FIG. 2), the method 20 (FIGS. 3A to 3D), the method 50 (FIG. 5), the system 60 (FIG. 6), and/or any of the features discussed herein. For example, the logic 170 may include technology to implement the host device/computer system/agent aspects of the various embodiments described herein while the logic 160 may include technology to implement the storage device aspects of the various embodiments described herein.

In particular, the logic 160 may be configured to set an erase voltage for a first block of the SSD 130 to a default erase voltage, determine if the first block of the SSD 130 is identified for a secure erase operation, and set the erase voltage for the first block of the SSD 130 to a shallow erase voltage if the first block of the SSD 130 is identified for the secure erase operation, where the shallow erase voltage corresponds to a weaker erase operation relative to the default erase voltage. For example, the shallow erase voltage may be between the default erase voltage and an EDTC state voltage. In some embodiments, the logic 160 may be further configured to perform an erase operation on the first block, determine if the first block is erased, and place the first block in an EDTC state and set the erase voltage for the first block back to the default erase voltage, if the first block is determined to be erased.

In some embodiments, the logic 160 may be configured to set the erase voltage for one or more blocks of the SSD 130 to the default erase voltage, identify the one or more blocks of the SSD 130 for the secure erase operation, set the erase voltage for the identified one or more blocks to the shallow erase voltage (e.g., where the shallow erase voltage corresponds to a more shallow erase distribution relative to the default erase voltage), and perform an erase operation on the identified one or more blocks. The logic 160 may be further configured to determine if all of the identified one or more blocks are erased, and place the identified one or more blocks in an EDTC state and set the erase voltage for the identified one or more blocks back to the default erase voltage, if all of the identified one or more blocks are determined to be erased.

In some embodiments, the logic 160 may be further configured to identify one or more blocks of the SSD 130 for the secure erase operation in response to a command, set the erase voltage to the shallow erase voltage on each memory device 392-1 to 392-N of the SSD 130 which corresponds to the identified one or more blocks, perform an erase operation for each of the identified one or more blocks after the erase voltage is set to the shallow erase voltage for each memory device 392-1 to 392-N, determine if all of the identified one or more blocks are erased, and place all of the identified one or more blocks in an EDTC state and set the erase voltage on each memory device 392-1 to 392-N for the identified one or more blocks back to the default erase voltage after all of the identified one or more blocks are determined to be erased.

In other embodiments, the SSD 130 may be replaced with any suitable storage/memory technology/media. In some embodiments, the logic 160/170 may be coupled to one or more substrates (e.g., silicon, sapphire, gallium arsenide, printed circuit board (PCB), etc.), and may include transistor channel regions that are positioned within the one or more substrates. In other embodiments, the SSD 130 may include two or more types of storage media. For example, the bulk of the storage may be NAND and may further include some faster, smaller granularity accessible (e.g., byte-addressable) NVM such as INTEL 3DXP media. The SSD 130 may alternatively, or additionally, include persistent volatile memory (e.g., battery or capacitor backed-up DRAM or SRAM). For example, the SSD 130 may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the persistent volatile memory. As shown in FIGS. 7 and 8, features or aspects of the logic 160 and/or the logic 170 may be distributed throughout the system 100, and/or co-located/integrated with various components of the system 100.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
one or more substrates; and
logic coupled to the one or more substrates, the logic configured to:
set an erase voltage for a first block of a persistent storage media to a default erase voltage,
determine if the first block of the persistent storage media is identified for a secure erase operation,
set the erase voltage for the first block of the persistent storage media to a shallow erase voltage if the first block of the persistent storage media is identified for the secure erase operation, where the shallow erase voltage corresponds to a weaker erase operation relative to the default erase voltage, and where the shallow erase voltage corresponds to a more shallow erase distribution relative to the default erase voltage,
perform an erase operation on the first block using the shallow erase voltage,
determine if the first block is erased, and
place the first block in an erase dwell time control state and set the erase voltage for the first block back to the default erase voltage, if the first block is determined to be erased, wherein:
the shallow erase voltage is between the default erase voltage and an erase dwell time control state voltage, and
the erase dwell time control state voltage is a program voltage associated with the erase dwell time control state.

2. The apparatus of claim 1, wherein the logic is further to:
set an erase voltage for one or more blocks of the persistent storage media in addition to the first block to the default erase voltage;
identify the one or more blocks of the persistent storage media for the secure erase operation;
set the erase voltage for the identified one or more blocks to the shallow erase voltage; and
perform an erase operation on the identified one or more blocks.

3. The apparatus of claim 2, wherein the logic is further to:
determine if all of the identified one or more blocks are erased; and
place the identified one or more blocks in the erase dwell time control state and set the erase voltage for the identified one or more blocks back to the default erase voltage, if all of the identified one or more blocks are determined to be erased.

4. The apparatus of claim 1, wherein the persistent storage media comprises one or more memory die, and wherein the logic is further to:
identify one or more blocks of the persistent storage media, in addition to the first block, for the secure erase operation in response to a command, and for each memory die that includes at least one block of the identified one or more blocks:
set an erase voltage on the memory die to the shallow erase voltage;
perform an erase operation for each of the identified one or more blocks on the memory die after the erase voltage on the memory die is set to the shallow erase voltage on;
determine if all of the identified one or more blocks on the memory die are erased; and
place all of the identified one or more blocks on the memory die in the erase dwell time control state and set the erase voltage on the memory die for the identified one or more blocks on the memory die back to the default erase voltage after all of the identified one or more blocks on the memory die are determined to be erased.

5. The apparatus of claim 1, wherein the persistent storage media is part of a NAND-based solid state drive, and wherein the logic is further to, for the secure erase operation, change internal NAND trims of the first block to force the more shallow erase distribution relative to the default erase voltage.

6. An electronic storage system, comprising:
persistent storage media; and
a controller communicatively coupled to the persistent storage media, the controller including logic configured to:
set an erase voltage for a first block of the persistent storage media to a default erase voltage,
determine if the first block of the persistent storage media is identified for a secure erase operation,
set the erase voltage for the first block of the persistent storage media to a shallow erase voltage if the first block of the persistent storage media is identified for the secure erase operation, where the shallow erase voltage corresponds to a weaker erase operation relative to the default erase voltage, and where the shallow erase voltage corresponds to a more shallow erase distribution relative to the default erase voltage,
perform an erase operation on the first block using the shallow erase voltage,
determine if the first block is erased, and
place the first block in an erase dwell time control state and set the erase voltage for the first block back to the default erase voltage, if the first block is determined to be erased, wherein:
the shallow erase voltage is between the default erase voltage and an erase dwell time control state voltage, and
the erase dwell time control state voltage is a program voltage associated with the erase dwell time control state.

7. The system of claim 6, wherein the logic is further to:
set an erase voltage for one or more blocks of the persistent storage media in addition to the first block to the default erase voltage;
identify the one or more blocks of the persistent storage media for the secure erase operation;
set the erase voltage for the identified one or more blocks to the shallow erase voltage; and
perform an erase operation on the identified one or more blocks.

8. The system of claim 7, wherein the logic is further to:
determine if all of the identified one or more blocks are erased; and
place the identified one or more blocks in the erase dwell time control state and set the erase voltage for the identified one or more blocks back to the default erase voltage, if all of the identified one or more blocks are determined to be erased.

9. The system of claim 6, wherein the persistent storage media comprises one or more memory die, and wherein the logic is further to:
identify one or more blocks of the persistent storage media, in addition to the first block, for the secure erase operation in response to a command, and for each memory die that includes at least one block of the identified one or more blocks:
set an erase voltage on the memory die to the shallow erase voltage;
perform an erase operation for each of the identified one or more blocks on the memory die after the erase voltage on the memory die is set to the shallow erase voltage;
determine if all of the identified one or more blocks on the memory die are erased; and
place all of the identified one or more blocks on the memory die in the erase dwell time control state and set the erase voltage on the memory die for the identified one or more blocks on the memory die back to the default erase voltage after all of the identified one or more blocks on the memory die are determined to be erased.

10. The system of claim 6, wherein the persistent storage media is part of a NAND-based solid state drive, and wherein the logic is further to, for the secure erase operation, change internal NAND trims of the first block to force the more shallow erase distribution relative to the default erase voltage.

11. A method of controlling storage, comprising:
setting an erase voltage for a first block of a persistent storage media to a default erase voltage;
determining the first block of the persistent storage media is identified for a secure erase operation;
setting the erase voltage for the first block of the persistent storage media to a shallow erase voltage when the first block of the persistent storage media is identified for the secure erase operation, where the shallow erase voltage corresponds to a weaker erase operation relative to the default erase voltage, and where the shallow erase voltage corresponds to a more shallow erase distribution relative to the default erase voltage, performing an erase operation on the first block using the shallow erase voltage;

determining the first block is erased; and placing the first block in an erase dwell time control state and setting the erase voltage for the first block back to the default erase voltage, after the first block is determined to be erased, wherein:

the shallow erase voltage is between the default erase voltage and an erase dwell time control state voltage, and the erase dwell time control state voltage is a program voltage associated with the erase dwell time control state.

12. The method of claim 11, further comprising:

setting an erase voltage for one or more blocks of the persistent storage media in addition to the first block to the default erase voltage;

identifying the one or more blocks of the persistent storage media for the secure erase operation;

setting the erase voltage for the identified one or more blocks to the shallow erase voltage; and performing an erase operation on the identified one or more blocks.

13. The method of claim 12, further comprising:

determining if all of the identified one or more blocks are erased; and placing the identified one or more blocks in the erase dwell time control state and setting the erase voltage for the identified one or more blocks back to the default erase voltage, if all of the identified one or more blocks are determined to be erased.

14. The method of claim 11, wherein the persistent storage media comprises one or more memory die, further comprising:

identifying one or more blocks of the persistent storage media, in addition to the first block, for the secure erase operation in response to a command, and for each memory die that includes at least one block of the identified one or more blocks:

setting an erase voltage on the memory die to the shallow erase voltage;

performing an erase operation for each of the identified one or more blocks on the memory die after the erase voltage on the memory die is set to the shallow erase voltage;

determining if all of the identified one or more blocks on the memory die are erased; and placing all of the identified one or more blocks on the memory die in the erase dwell time control state and set the erase voltage on the memory die for the identified one or more blocks on the memory die back to the default erase voltage after all of the identified one or more blocks on the memory die are determined to be erased.

15. The method of claim 11, wherein the persistent storage media is part of a NAND-based solid state drive, and wherein the logic is further to, for the secure erase operation, change internal NAND trims of the first block to force the more shallow erase distribution relative to the default erase voltage.

* * * * *